United States Patent [19]

Ogitani et al.

[11] Patent Number: 4,985,474

[45] Date of Patent: Jan. 15, 1991

[54] HARDENABLE RESIN COMPOSITION

[75] Inventors: Osamu Ogitani, Koshigaya; Ryuichi Fujii, Urawa, both of Japan

[73] Assignee: Somar Corporation, Japan

[21] Appl. No.: 434,263

[22] Filed: Nov. 13, 1989

[30] Foreign Application Priority Data

Nov. 16, 1988 [JP] Japan ................... 63-289819

[51] Int. Cl.$^5$ .................... C08L 33/08; C08L 33/10
[52] U.S. Cl. .................... 522/107; 524/272; 527/603; 527/604
[58] Field of Search ............ 522/107; 527/604, 603; 524/272

[56] References Cited

U.S. PATENT DOCUMENTS

| | | | |
|---|---|---|---|
| 2,344,194 | 3/1944 | Anderson | 527/604 |
| 4,148,654 | 4/1979 | Oddi | 430/270 |
| 4,293,636 | 10/1981 | Okuya | 522/43 |

FOREIGN PATENT DOCUMENTS 0059606  3/1987  Japan .

*Primary Examiner*—Marion C. McCamish
*Assistant Examiner*—Susan Berman
*Attorney, Agent, or Firm*—Lorusso & Loud

[57] ABSTRACT

A resin composition hardenable by irradiation of a high energy ray is disclosed, which includes:
(a) a resin selected from the group consisting of rosins and modified rosins and having an acid value of at least 150 and a Gardner color scale of not greater than 15;
(b) a compound of the general formula (I):

$$Y-CO-O-A-O)_m CO-CR=CH_2 \qquad (I)$$

wherein Y represents

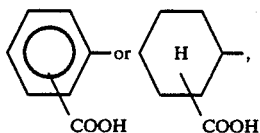

A represents an alkylene having 1–4 carbon atoms, R represents hydrogen or methyl and m is an integer of 1–4;
(c) a hydroxyl group-containing compound having only one acrylic or methacrylic group and at least one hydroxyl group; and
(d) a polyol compound having at least two hydroxyl groups. The resin composition is useful for plugging through-holes of a metal plated board in manufacturing printed wiring boards.

11 Claims, No Drawings

HARDENABLE RESIN COMPOSITION

BACKGROUND OF THE INVENTION

This invention relates generally to a resin composition hardenable by irradiation of a high energy ray and, more specifically to a resin composition suitable for plugging through-holes of a metal-plated board in manufacturing printed wiring boards.

Recent development of electronics art demands printed wiring boards having a high circuit density. Thus, printed wiring boards provided with wiring patterns on both sides thereof are now increasingly used. One well known method for the production of such both-sides wiring boards includes the steps of: drilling or punching a board to form a multiplicity of through-holes, plating copper on both sides of the board and on inside walls of the through-holes, plugging the through-holes with an alkali-soluble resin, curing or hardening the resin within the through-holes, abrading or sanding both surfaces of the metal-plated board to remove a layer or deposit of the resin thereon, screen printing positive patterns with an alkalisoluble resist, curing the resist patterns, etching the exposed metal layer with an acidic etching liquid, and removing the resist patterns and the plugged resin using a 2–3% aqueous sodium hydroxide solution.

The plugging of the through-holes is generally performed as follows. A curable or hardenable resin is first applied to the board by means of, for example, a roll coater to plug the through-holes. An excess resin on the surface of the board is then removed by a squeegee and the resin plugged in the through-holes is heat-treated or UV-treated for effecting curing or hardening. The resulting board is then sanded or abraded by means of a buff roll or a belt sander to remove a layer of the hardened resin, which has been failed to be removed during the treatment with the squeegee, and to clean the surface of the metal-plated board.

As a resin for plugging through-holes of the board, there has been used a heat-curable or a photo-curable resin. Since a photo-curable resin can be hardened within a shorter period of time as compared with a heat-curable resin and since the former resin is substantially free of change of volume upon hardening, recent trend is toward the use of the former resin. The former resin, however, poses problems because only a surface portion of the resin within the through-holes is hardened when irradiated by UV rays and because the hardened resin is not easily dissolved in an alkali solution.

More particularly, with the known UV-hardenable resin, the hardening occurs only in a depth of about ⅓ from both surfaces of the through-hole and the remainder of the intermediate ⅓ portion remains still unhardened. As a result, the resin which has not yet been hardened is often exposed on the surface during the abrading steps to cause various problems in the succeeding steps. In the step of removing the hardened resin by spraying an aqueous alkaline solution, such as a 3% aqueous sodium hydroxide solution, which is to be carried out after the formation of wiring pattern by etching, about 10 minutes are required for completely dissolving the hardened resin in the solution even when this treatment is performed at about 45° C.

With a view toward overcoming the above problems, there has been proposed in Japanese Published Unexamined Patent Application No. 62-59606 an improved resin composition containing the following ingredients:
(a) a resin selected from the group consisting of rosins and modified rosins and having an acid value of at least 150 and a Gardner color scale of not greater than 15;
(b) a compound of the general formula (I):

$$Y-CO-O(-A-O)_{\overline{m}}CO-CR=CH_2 \quad (I)$$

wherein Y represents

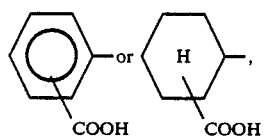

A represents an alkylene having 1–4 carbon atoms, R represents hydrogen or methyl and m is an integer of 1–4;
(c) a hydroxyl group-containing compound having only one acrylic or methacrylic group and at least one hydroxyl group.

While the hardening of this composition proceeds satisfactorily not only in surface portions but also in a middle portion of the through-holes and the period of time required for removing the hardened resin by contact with an alkaline liquid is about a half of that required in the case of using the above conventional resin composition, this composition still encounters a problem because the impact strength of the hardened resin is not high. Thus, during the abrasion step for removing excess hardened resins on the surface of the board, cracks tend to be formed in the hardened resin bodies within the throughholes, which also causes breakage of the plugging resin bodies. When such cracking or breakage occurs, the plated layer inside of the through-holes are attacked by an etching solution in the succeeding stage, causing electrical disconnection between the wiring patterns on the both sides of the board.

SUMMARY OF THE INVENTION

It is, therefore, an object of the present invention to provide an improved hardenable resin composition which is suitably used for plugging through-holes of metal plated boards.

Another object of the present invention is to provide a resin composition of the above-mentioned type which is easily hardened by irradiation of a high energy ray, especially UV ray or electron beam, and which affords hardened resin bodies excellent in impact strength and in solubility in an alkali liquid.

In accomplishing the foregoing objects, the present invention provides a resin composition hardenable by irradiation of a high energy ray comprising the following ingredients (a) through (d):
(a) a resin selected from the group consisting of rosins and modified rosins and having an acid value of at least 150 and a Gardner color scale of not greater than 15;
(b) a compound of the general formula (I):

$$Y-CO-O(-A-O)_{\overline{m}}CO-CR=CH_2 \quad (I)$$

wherein Y represents

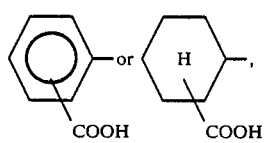

A represents an alkylene having a 1–4 carbon atoms, R represents hydrogen or methyl and m is an integer of 1–4;

(c) a hydroxyl group-containing compound having only one acrylic or methacrylic group and at least one hydroxyl group; and (d) a polyol compound having at least two hydroxyl groups.

The term "acid number" used in the present specification in connection with rosins or modified rosins is defined as the amount (mg) of potassium hydroxide required for neutralizing 1 g of the sample. The acid number is measured in accordance with JIS K5400 by titration of a solution of the sample in toluene, methyl ethyl ketone or the like solvent using a 0.1 N aqueous potassium hydroxide solution and phenolphthalein as an indicator.

The term "Gardner color scale" used in the present specification in connection with rosins or modified rosins is defined as a scale of the Gardner color standard whose color corresponds to the color of a 50% by weight solution of a sample in methyl ethyl ketone and is measured in accordance with JIS K5400.

Other objects, features and advantages of the present invention will become apparent from the detailed description of the invention to follow.

DETAILED DESCRIPTION OF THE INVENTION

The resin composition according to the present invention contains ingredients (a)–(d) as main ingredients.

Ingredient (a) is a resin which is a rosin or a modified rosin and which has an acid value of at least 150 and a Gardner color scale of not greater than 15. An acid value of the rosin or modified rosin of at least 150 is necessary in order to obtain suitable solubility of the hardened resin composition in an alkaline solution. When the Gardner color scale of the rosin or modified rosin exceeds 15, the hardening of a layer or body of the resulting composition with which through-holes are plugged fails to proceed sufficiently in the inside thereof.

The modified rosin is preferably one which is modified with an acid or an alcohol. Illustrative of suitable acids for the modification of rosin are maleic acid, maleic anhydride, fumaric acid, fumaric anhydride, phthalic acid and phthalic anhydride. Illustrative of suitable alcohols are pentaerythritol and glycerin. If desired, the rosin or modified rosin may be used in conjunction with a small amount of a resin such as a carboxyl group-containing polymer (such as SMR Resin manufactured by ARCO Chemical Company, U.S.A. or OXYLAC manufactured by Nihon Shokubai Kagaku Kogyo K. K.), a phenol novolak resin or a cresol novolak resin.

Ingredient (b) is a compound the above general formula (I). Examples of suitable compounds are as follows:

(1) Monoacryloyloxyethyl hexahydrophthalate

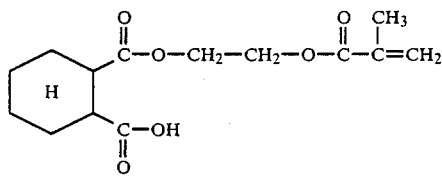

(2) Monomethacryloyloxy-1-isopropyl hexahydrophthalate

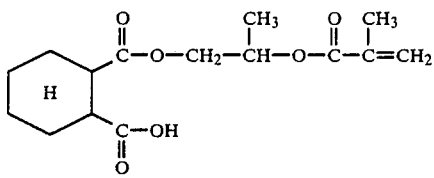

(3) Monoacryloyloxyethyl hexahydrophthalate

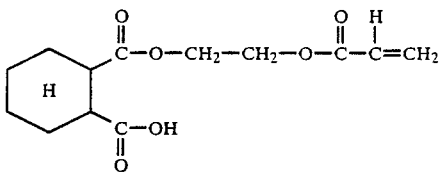

(4) Monomethacryloyloxyethyl phthalate

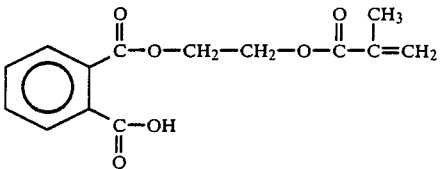

(5) Monomethacryloyloxy-1-isopropyl phthalate

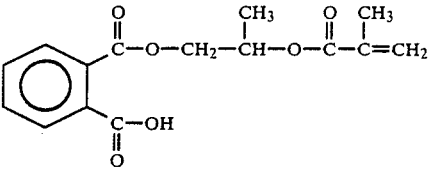

(6) Monoacryloyloxyethyl phthalate

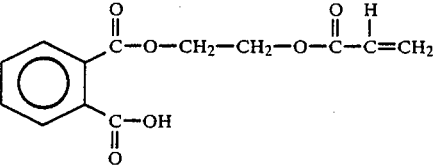

Ingredient (c) is a hydroxyl group-containing compound having only one acrylic or methacrylic group and at least one hydroxyl group and, preferably, is liquid at room temperature. Examples of such compounds include 2-hydroxyethyl acrylate, 2-hydroxethyl methacrylate, 2-hydroxypropyl acrylate and 2-hydroxypropyl methacrylate. The hydroxyl group-containing compound serves to improve removability of the hardened resin composition by dissolution into an alkali solution.

Ingredient (d) is a polyol having at least two hydroxyl groups and is preferably glycerin or a diol which is liquid at room temperature. The diol may include, for example, ether-containing diols having the following general formula:

HO$-(C_mH_{2m}O)_n$H wherein m and n each stand for an integer of 1 or more.

Illustrative of suitable ether-containing diol are ethylene glycol, propylene glycol, polyethylene glycol, polypropylene glycol and a polyalkylene glycol having both oxyethylene and oxypropylene groups. The use of a polyethylene glycol which is liquid at room temperature is especially preferred. The polyol serves to improve the impact strength of a hardened body of the resin composition.

The preferred amounts of ingredients (a) through (d) are as follows:

ingredient (a): 15–60%
ingredient (b): 10–60%
ingredient (c): 10–50%
ingredient (d): 1–30%
based on the total weight of ingredients (a) through (d), wherein the proportion of ingredient (b) is 30–85% based on the total weight of ingredients (b) and (c).

More preferred ranges are as follows:
ingredient (a): 25–50%
ingredient (b): 15–50%
ingredient (c): 15–50%
ingredient (d): 1–25%
based on the total weight of ingredients (a) through (d), wherein the proportion of ingredient (b) is 35–80% based on the total weight of ingredients (b) and (c).

An amount of ingredient (a) below 15% by weight is undesirable because the viscosity of the resulting resin composition becomes too low to properly plug through-holes of a board and, additionally, because it becomes difficult to remove the hardened resin by dissolution into an alkali solution. When the amount of ingredient (a) exceeds 60% by weight, the resulting resin composition becomes so viscous that it becomes difficult to plug through-holes therewith.

An amount of ingredient (b) below 10% by weight causes difficulties in removing the hardened resin by dissolution into an alkali solution. Too large an amount of ingredient (b) in excess of 60% weight is undesirable because the resulting resin composition becomes very viscous.

An amount of ingredient (c) below 10% by weight is insufficient to provide a hardened resin having good removability. On the other hand, too large an amount of ingredient (c) in excess of 50% by weight is undesirable because the viscosity of the resin composition becomes excessively low.

An amount of ingredient (d) below 1% by weight is insufficient to improve the impact strength of a hardened body of the resin composition. On the other hand, when the amount of ingredient (d) exceeds 30% by weight, the hardened body becomes soft and sticky.

The hardenable resin composition according to the present invention may further contain one or more additives such as a photopolymerization photosensitizer, a filler, a thermal polymerization inhibitor and anti-foaming agents.

Illustrative of suitable photosensitizers are benzoin, phenyl ketone compounds such as 1-hydroxycyclohexyl phenyl ketone and ether derivatives of benzoin compounds such as shown below:

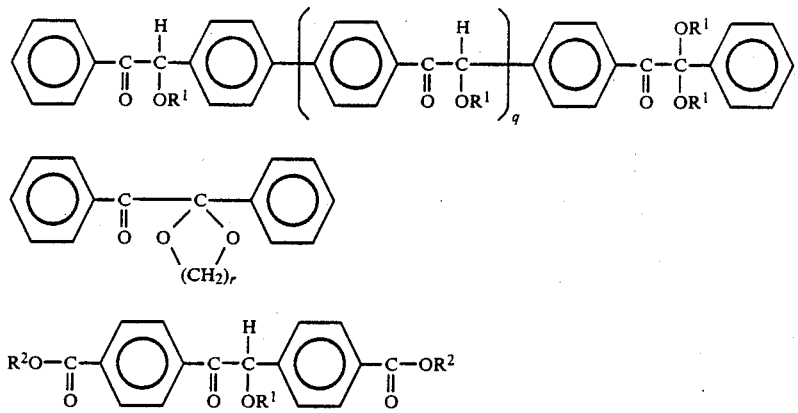

wherein $R^1$ and $R^2$ represent independently from each other an alkyl group having 1–18 carbons, a cycloalkyl group or a phenyl group and q and r are integers of 1–6. The photosensitizer may be used in an amount of 2–20% by weight, preferably 4–15% by weight based on the weight of the resin composition.

Illustrative of suitable fillers are silicon dioxide, aluminum silicate, magnesium silicate and aluminum hydroxide. The filler preferably has an average particle size of 10 μm or less and is used in an amount of 20% by weight or less based on the weight of the resin composition. The filler serves to adjust the viscosity of the resin composition to a suitable range.

Illustrative of suitable thermal polymerization inhibitors are hydroquinone, 4-methoxyphenol, 2,6-di-tert-butyl4-cresol, 2,2-methylenebis(4-ethyl-6-tert-butylphenol), tertbutylcatechol, pyrogallol, 2-napthylamine, 4-toluquinone, triphenylphosphite, a salt or a chelate (Al, Cu or Zn) of N-nitrosophenylhydroxylamine and ethylenediamine tetraacetic acid or a salt thereof. The inhibitor is generally used in an amount of 0.005-3% by weight based on the weight of the composition.

As the anti-foaming agent, there may be used silicone compounds generally used in screen printing inks. The amount of the agent is generally 0.005-1% by weight based on the resin composition.

The hardenable resin composition of the present invention may be suitably prepared in the following manner. Ingredients (b), (c) and (d) and, if necessary, a thermal polymerization inhibitor are mixed and heated at 40°–100 °C. to obtain a homogeneous solution, to which is then added ingredient (a) with stirring for dissolution. The resulting solution is further blended with a photosensitizer and/or a filler, if desired, and the blend is homogeneously mixed using a roll mill or the like mixer. The hardenable resin when irradiated by UV rays, electron beams or the like high energy rays is hardened as a result of photopolymerization.

The following examples will further illustrate the present invention. In the examples, "part" is by weight.

EXAMPLE 1

A resin composition composed of the following ingredients was prepared:

| Ingredient (a) | |
|---|---|
| Modified rosin *1: | 40 parts |
| Ingredient (b) | |
| Acrylic ester *2: | 35 parts |
| Ingredient (c) | |
| 2-Hydroxyethyl methacrylate: | 15 parts |
| Ingredient (d) | |
| Polyethylene glycol *3: | 10 parts |
| Benzoin isopropyl ether: | 8 parts |
| Silica *4: | 2 parts |
| N-Nitrosophenylhydroxylamine ammonium salt *5: | 0.05 part |

*1: Rosin modified with maleic anhydride and pentaerythritol. Acid value: 305, Gardner scale: 8
*2: Monomethacryloyloxyethyl hexahydrophthalate
*3: Average molecular weight: 2000
*4: TOKUSEAL U manufactured by Tokuyama Soda Inc.
*5: CUPHERRON Q-1300 manufactured by Wako Junyaku Inc.

The thus obtained resin composition was tested for its hardenability and for removability and crack-resistance of its hardened product. The test results are summarized in Table 1. The test methods are as follows:

HARDENABILITY TEST

A plate-like jig having a rectangular groove is provided. The bottom of the groove is sloped such that the depth of the groove increases continuously gradually from 0 to 1.5 mm in a direction from one end thereof to the other opposite end. After placing a polyester film (thickness: 100 μm) on the bottom of the groove, the groove is filled with a test sample to form a resin layer whose top surface is rendered flat. The thickness of the resin layer thus gradually increases from one end to the other end thereof inconformity with the shape of the groove. The jig is then passed at a conveying speed of 1.5 m/minute beneath a high pressure mercury lamp (80 W/cm) with a distance therebetween of 15 cm, thereby to harden the resin layer. The UV-treated resin layer is removed from the groove together with the polyester film and the thickness of the resin layer at a position where the resin has been completely hardened throughout its thickness and where the thickness becomes maximum is measured. The maximum thickness (excluding the thickness of the polyester film) represents the hardenability of the sample resin. The greater the thickness, the better is the hardenability.

REMOVABILITY TEST

A test sample is applied to a copper clad laminate (thickness: 1.6 mm) having a copper-plated through-holes having a diameter of 3 mm using a roll coater so as to plug the through-hole. The laminate is then passed, at a conveying speed of 2 m/minutes, through a pair of high pressure mercury lamps (80 W/cm) with a distance between the laminate and each lamp being 15 cm so that the plug resin in the through-hole is irradiated by UV rays from both sides thereof. An aqueous sodium hydroxide solution (3% by weight) at 40° C. is then continuously poured at a constant flow rate on the plugged through-hole. The period of time from the start of the pouring till the solution has passed through the through-hole represents the removability of the sample resin. The shorter this period the better is the removability.

CRACKING TEST

A test sample is applied onto a copper clad laminate (thickness: 1.6 mm) to form a resin layer having a thickness of 320 μm. The laminate is then passed at a conveying speed of 2.0 m/minute beneath a high pressure mercury lamp (80 W/cm) with a distance therebetween of 15 cm, thereby to harden the resin layer. A metal ball weighing 5.4 g is dropped on the hardened layer to check whether or not crack is formed in the resin layer. This procedure is repeated while gradually increasing the height of the ball from which it is dropped. The maximum height above which crack is caused represents crack-resistance. The greater the height, the better is the resistance to crack (impact strength).

COMPARATIVE EXAMPLE 1

A resin composition was prepared in the same manner as that in Example 1 except that no polyethylene glycol was used and that the amount of hydroxyethyl methacrylate was increased to 25 parts. The composition was then tested for its hardenability and for removability and crack-resistance of its hardened product. The test results are summarized in Table 1.

TABLE 1

| | Example 1 | Comparative Example 1 |
|---|---|---|
| Hardenability (μm) | 840 | 830 |
| Removability (second) | 80 | 85 |
| Crack-Resistance (cm) | 40 | 5 |

EXAMPLE 2

Example 1 was repeated in the same manner as described except that a polyethylene glycol having an average molecular weight of 1000 was used as ingredient (d). The crack-resistance of the hardened product of the resin composition was found to be 46 cm.

EXAMPLE 3

Example 1 was repeated in the same manner as described except that a polyethylene glycol having an average molecular weight of 6000 was used as ingredient (d). The crack-resistance of the hardened product of the resin composition was 42 cm.

EXAMPLE 4

Example 1 was repeated in the same manner as described except that 2-hydroxyethyl methacrylate was used in an amount of 20 parts and that 5 parts of glycerin were used in place of 10 parts of the polyethylene glycol. The crack-resistance of the hardened product of the resin composition was 39 cm.

EXAMPLE 5

Example 1 was repeated in the same manner as described except that 2-hydroxyethyl methacrylate was used in an amount of 20 parts and that 5 parts of propylene glycol were used in place of 10 parts of the polyethylene glycol. The crack-resistance of the hardened product of the resin composition was 42 cm.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A resin composition hardenable by irradiation of a high energy ray, comprising the following ingredients (a) through (d):
   (a) a resin selected from the group consisting of rosins and modified rosins and having an acid value of at least 150 and a Gardner color scale of not greater than 15;
   (b) a compound of the general formula (I):

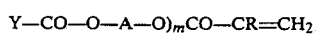

wherein Y represents

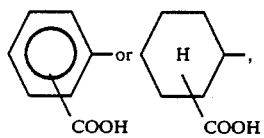

A represents an alkylene having 1-4 carbon atoms, R represents hydrogen or methyl and m is an integer of 1-4;
   (c) a hydroxyl group-containing compound having only one acrylic or methacrylic group and at least one hydroxyl group; and
   (d) 1-30 wt. %, based on the total weight of the composition, of glycerin or a diol which is liquid at room temperature.

2. A composition as set forth in claim 1, wherein said modified rosins are rosins modified with an acid or an alcohol.

3. A composition as set forth in claim 2, wherein said acid is selected from the group consisting of maleic acid, maleic anhydride, fumaric acid, fumaric anhydride, phthalic acid and phthalic anhydride, and said alcohol is selected from the group consisting of pentaerythritol and glycerin.

4. A composition as set forth in claim 1, wherein said compound of the formula (I) is selected from the group consisting of monoacryloyloxyethyl hexahydrophthalate, monomethacryloyloxy-1-isopropyl hexahydrophthalate, monoacryloyloxyethyl hexahydrophthalate, monomethacryloyloxyethyl phthalate, monomethacryloyloxy-1-isopropyl phthalate and monoacryloyloxyethyl phthalate.

5. A composition as set forth in claim 1, wherein said hydroxyl group-containing compound is a compound selected from the group consisting of 2-hydroxyethyl acrylate, 2-hydroxyethyl methacrylate, 2-hydroxypropyl acrylate and 2-hydroxypropyl methacrylate.

6. A composition as set forth in claim 1, wherein said diol is a member selected from ether-containing diols having the following general formula:

wherein m and n each stand for an integer of 1 or more.

7. A composition as set forth in claim 6, wherein said ether-containing diol is a member selected from the group consisting of ethylene glycol, propylene glycol, polyethylene glycol, polypropylene glycol and a polyalkylene glycol having both oxyethylene and oxypropylene groups.

8. A composition as set forth in claim 1, wherein the amounts of ingredients (a) through (d) are as follows:
   ingredient (a): 15-60%
   ingredient (b): 10-60%
   ingredient (c): 10-50%
   ingredient (d): 1-30%
   based on the total weight of ingredients (a) through (d), with the proportion of ingredient (b) being 30-85% based on the total weight of ingredients (b) and (c).

9. A composition as set forth in claim 1, wherein the amounts of ingredients (a) through (d) are as follows:
   ingredient (a): 25-50%
   ingredient (b): 15-50%
   ingredient (c): 15-50%
   ingredient (d): 1-25%
   based on the total weight of ingredients (a) through (d), with the proportion of ingredient (b) being 35-80% based on the total weight of ingredients (b) and (c).

10. A composition as set forth in claim 1, further comprising at least one additive selected from the group consisting of photopolymerization photosensitizers, fillers, thermal polymerization inhibitors and anti-foaming agents.

11. A composition as set forth in claim 1, which is hardenable upon irradiation of UV rays or electron beams to give a hardened product which is soluble in an aqueous alkaline liquid.

* * * * *

UNITED STATES PATENT AND TRADEMARK OFFICE
CERTIFICATE OF CORRECTION

PATENT NO. : 4,985,474

DATED : January 15, 1991

INVENTOR(S) : OGITANI et al

It is certified that error appears in the above-identified patent and that said Letters Patent is hereby corrected as shown below:

IN THE ABSTRACT:

Line 9, "Y-CO-O-A-O)$_n$CO-CR=CH$_2$" should read

--Y-CO-O$-$(A-O)$_m$CO-CR=CH$_2$--

Col. 1, line 24, "alkalisoluble" should read --alkali-soluble--.

Col. 6, line 58, "butyl14-cresol" should read --butyl-4-cresol--; and line 59, "tertbutylcatechol" should read --tert-butylcatechol--.

UNITED STATES PATENT AND TRADEMARK OFFICE
CERTIFICATE OF CORRECTION

PATENT NO. : 4,985,474
DATED : January 15, 1991
INVENTOR(S) : OGITANI et al

It is certified that error appears in the above-identified patent and that said Letters Patent is hereby corrected as shown below:

Col. 9, line 30, "$Y-CO-O-A-O)_m CO-CR=CH_2$" should read

--$Y-CO-O-(A-O)_m CO-CR=CH_2$-- .

Col. 10, line 20, "$HO-C_m H_{2m} O)_n H$" should read

--$HO-(C_m H_{2m} O)_n H$-- .

Signed and Sealed this

Twenty-ninth Day of September, 1992

Attest:

DOUGLAS B. COMER

Attesting Officer

Acting Commissioner of Patents and Trademarks